(12) United States Patent
Takahashi

(10) Patent No.: US 11,251,758 B2
(45) Date of Patent: Feb. 15, 2022

(54) POWER AMPLIFIER CIRCUIT, SEMICONDUCTOR DEVICE, AND METHOD FOR MANUFACTURING SEMICONDUCTOR DEVICE

(71) Applicant: Murata Manufacturing Co., Ltd., Kyoto (JP)

(72) Inventor: Yoshifumi Takahashi, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/998,598

(22) Filed: Aug. 20, 2020

(65) Prior Publication Data

US 2021/0058043 A1 Feb. 25, 2021

(30) Foreign Application Priority Data

Aug. 21, 2019 (JP) .............................. JP2019-151304

(51) Int. Cl.
*H03G 3/30* (2006.01)
*H03F 3/24* (2006.01)
*H03F 3/195* (2006.01)

(52) U.S. Cl.
CPC ............ *H03F 3/245* (2013.01); *H03F 3/195* (2013.01); *H03F 2200/211* (2013.01); *H03F 2200/318* (2013.01); *H03F 2200/451* (2013.01)

(58) Field of Classification Search
CPC .................................. H03G 3/30; H03F 1/30
USPC ......................................... 330/278, 285, 296
See application file for complete search history.

(56) References Cited

U.S. PATENT DOCUMENTS

| 5,752,171 A | * | 5/1998 | Akiya | .................. H03G 3/3042 330/279 |
| 2012/0297263 A1 | * | 11/2012 | Taya | ................... G01R 31/2884 714/733 |
| 2017/0187331 A1 | | 6/2017 | Lam et al. | |
| 2019/0140595 A1 | | 5/2019 | Lam et al. | |

* cited by examiner

*Primary Examiner* — Henry Choe
(74) *Attorney, Agent, or Firm* — Pearne & Gordon LLP

(57) ABSTRACT

A power amplifier circuit includes an amplifier unit disposed on a die of a semiconductor device. The amplifier unit includes an amplifier transistor. The power amplifier circuit further includes a detector transistor disposed on the die of the semiconductor device, a variable attenuator that compensates for a gain of the amplifier unit, a bias level setting holding unit that holds a bias level setting value, which is set based on at least a detection value of the detector transistor, and a bias generation unit that generates a bias value of the variable attenuator based on the bias level setting value.

20 Claims, 8 Drawing Sheets

| AMPLIFICATION FACTOR β | DATA |
|---|---|
| A ≦ β < B | 000 |
| B ≦ β < C | 001 |
| C ≦ β < D | 010 |
| D ≦ β < E | 011 |
| E ≦ β < F | 100 |
| F ≦ β < G | 101 |
| G ≦ β < H | 110 |
| H ≦ β < I | 111 |

POWER AMPLIFIER CIRCUIT, SEMICONDUCTOR DEVICE, AND METHOD FOR MANUFACTURING SEMICONDUCTOR DEVICE

This application claims priority from Japanese Patent Application No. 2019-151304 filed on Aug. 21, 2019. The content of this application is incorporated herein by reference in its entirety.

BACKGROUND

The present disclosure relates to a power amplifier circuit, a semiconductor device, and a method for manufacturing the semiconductor device. Techniques for compensating for temperature characteristics of a transistor in a power amplifier are disclosed (e.g., U.S. Patent Application Publication No. 2017/0187331).

Semiconductor devices constituting power amplifier circuits and including, as semiconductor materials, compound semiconductor materials, such as gallium arsenide (GaAs) or Si-based materials, such as silicon germanium (SiGe) have been recently under development. Power amplifier circuits designed using such semiconductor devices may not satisfy required performance, such as gain characteristics, if process variation in transistors is large.

BRIEF SUMMARY

The present disclosure provides a power amplifier circuit, a semiconductor device, and a method for manufacturing the semiconductor device in which gain variation due to process variation in the semiconductor device can be compensated for.

According to embodiments of the present disclosure, there is provided a power amplifier circuit including an amplifier unit disposed on a die of a semiconductor device, the amplifier unit including an amplifier transistor; a detector transistor disposed on the die of the semiconductor device; a variable attenuator that compensates for a gain of the amplifier unit; a bias level setting holding unit that holds a bias level setting value, the bias level setting value being set based on at least a detection value of the detector transistor; and a bias generation unit that generates a bias value of the variable attenuator based on the bias level setting value.

This configuration can compensate for the gain variation in the amplifier unit due to process variation in the semiconductor device.

According to embodiments of the present disclosure, there is provided a semiconductor device including an amplifier unit including an amplifier transistor; a detector transistor; a variable attenuator that compensates for a gain of the amplifier unit; a bias level setting holding unit that holds a bias level setting value, the bias level setting value being set based on at least a detection value of the detector transistor; and a bias generation unit that generates a bias value of the variable attenuator based on the bias level setting value. At least the amplifier transistor and the detector transistor are disposed on an identical die.

This configuration can compensate for the gain variation in the amplifier unit due to process variation in the semiconductor device.

According to embodiments of the present disclosure, there is provided a method for manufacturing a semiconductor device including an amplifier unit including an amplifier transistor, a detector transistor, a variable attenuator that compensates for a gain of the amplifier unit, a bias level setting holding unit that holds a bias level setting value, the bias level setting value being set based on at least a detection value of the detector transistor, and a bias generation unit that generates a bias value of the variable attenuator based on the bias level setting value, at least the amplifier transistor and the detector transistor being disposed on an identical die. The method includes the steps of calculating an amplification factor of the detector transistor; generating the bias level setting value based on the amplification factor; and writing the bias level setting value to the bias level setting holding unit.

This can compensate for the gain variation in the amplifier unit due to process variation in the semiconductor device.

According to embodiments of the present disclosure, it is possible to implement a power amplifier circuit, a semiconductor device, and a method for manufacturing the semiconductor device in which gain variation due to process variation in the semiconductor device can be compensated for.

Other features, elements, characteristics and advantages of the present disclosure will become more apparent from the following detailed description of embodiments of the present disclosure with reference to the attached drawings.

DETAILED DESCRIPTION

The following describes power amplifier circuits according to embodiments in detail with reference to the drawings.

The embodiments are not intended to limit the present disclosure. It is to be understood that the embodiments are illustrative and that configurations presented in different embodiments may be partially replaced or combined. In the second embodiment, description of matters common to the first embodiment is omitted, and only the differences will be described. In particular, similar operational effects achieved with similar configurations will not be described again in the individual embodiments.

First Embodiment

Figure 1:
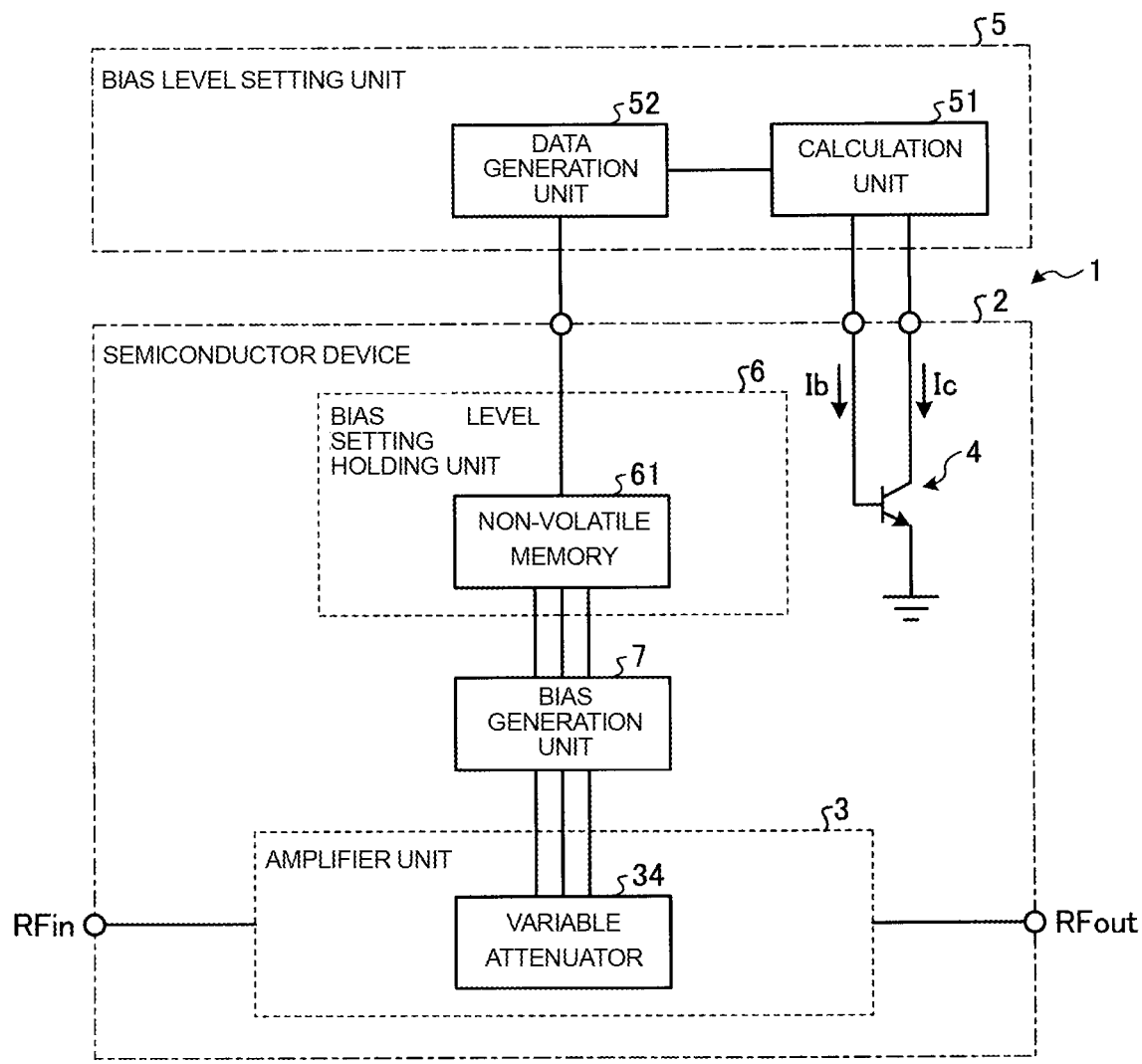
FIG. 1 illustrates a schematic configuration of a power amplifier circuit according to a first embodiment.

FIG. 1 illustrates a schematic configuration of a power amplifier circuit according to a first embodiment. A power amplifier circuit 1 according to the first embodiment includes, on a die of a semiconductor device 2, an amplifier unit 3, a detector transistor 4, a bias level setting holding unit 6, and a bias generation unit 7. In this embodiment, the detector transistor 4 is described as a bipolar transistor. In this case, amplifier transistors constituting the amplifier unit 3 are also bipolar transistors. The detector transistor 4 and the amplifier transistors may be field-effect transistors. The term "die", as used herein, refers to a small piece, and is used to indicate a semiconductor chip. Although a die itself is not illustrated in the drawings, a structure having the semiconductor device 2 mounted thereon is illustrated.

In this embodiment, the semiconductor device 2 is made of silicon germanium (SiGe) as a semiconductor material, for example. In the amplifier unit 3 on the die of the semiconductor device 2, large process variation in the amplification factor (or the transconductance in the case of field-effect transistors) of the transistors constituting the amplifier unit 3 may cause a variation in the gain of the amplifier unit 3, and the performance required for the power amplifier circuit 1 may not be satisfied.

Figure 2A:
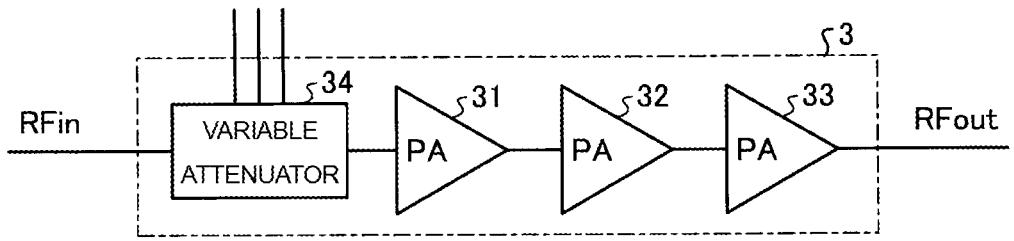
FIG. 2A illustrates a first example configuration of an amplifier unit.
Figure 2B:
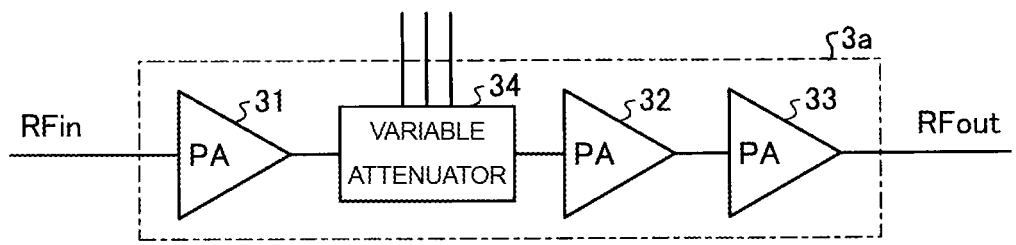
FIG. 2B illustrates a second example configuration of the amplifier unit.
Figure 2C:
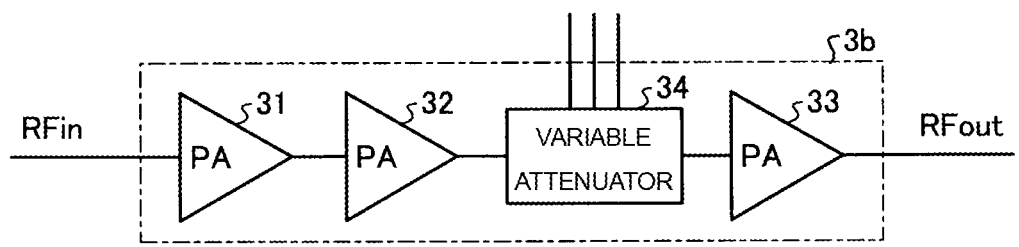
FIG. 2C illustrates a third example configuration of the amplifier unit.
Figure 2D:
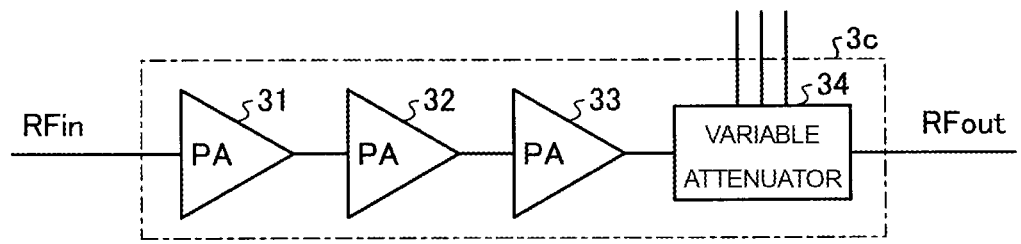
FIG. 2D illustrates a fourth example configuration of the amplifier unit.

The amplifier unit 3 amplifies a radio-frequency (RF) input signal RFin and outputs an RF output signal RFout. The amplifier unit 3 includes a variable attenuator 34 for compensating for the gain of the amplifier unit 3. FIG. 2A illustrates a first example configuration of the amplifier unit 3. FIG. 2B illustrates a second example configuration of the amplifier unit 3 (hereinafter referred to "amplifier unit 3a"). FIG. 2C illustrates a third example configuration of the amplifier unit 3 (hereinafter referred to "amplifier unit 3b"). FIG. 2D illustrates a fourth example configuration of the amplifier unit 3 (hereinafter referred to "amplifier unit 3c").

In the examples illustrated in FIGS. 2A, 2B, 2C, and 2D, the amplifier units 3, 3a, 3b, and 3c are each an RF power amplifier with a three-stage configuration including a first power amplifier 31, a second power amplifier 32, and a third power amplifier 33. In this embodiment, three stages of power amplifiers are used, by way of example but not limitation. For example, two stages of power amplifiers may be used, or four or more stages of power amplifiers may be used.

The first power amplifier 31, the second power amplifier 32, and the third power amplifier 33 are constituted by amplifier transistors that are constructed by electrically connecting a plurality of unit transistors in parallel. The term "unit transistor" refers to a minimum element constituting an amplifier transistor. The amplifier transistors constituting the first power amplifier 31, the second power amplifier 32, and the third power amplifier 33 are formed by a plurality of unit transistors. Accordingly, power required to drive the amplifier unit 3 can be maintained.

The amplifier transistors constituting the first power amplifier 31 are formed by, for example, two unit transistors. The amplifier transistors constituting the second power amplifier 32 are formed by, for example, eight unit transistors. The amplifier transistors constituting the third power amplifier 33 are formed by, for example, 22 unit transistors. The numbers of unit transistors of the amplifier transistors constituting the first power amplifier 31, the second power amplifier 32, and the third power amplifier 33 described above are an example and are not intended in a limiting sense.

As illustrated in FIG. 2A, the variable attenuator 34 is preferably disposed prior to the first power amplifier 31, that is, disposed in the input stage of the amplifier unit 3. Alternatively, as illustrated in FIG. 2B, the variable attenuator 34 may be disposed between the first power amplifier 31 and the second power amplifier 32, or, as illustrated in FIG. 2C, between the second power amplifier 32 and the third power amplifier 33. Alternatively, as illustrated in FIG. 2D, the variable attenuator 34 may be disposed subsequent to the third power amplifier 33, that is, disposed in the output stage of the amplifier unit 3.

Although not illustrated, an input matching circuit is disposed prior to the first power amplifier 31, that is, disposed in the input stage of the amplifier unit 3. As illustrated in FIG. 2A, in a case where the variable attenuator 34 is disposed prior to the first power amplifier 31, the input matching circuit may include the variable attenuator 34.

Although not illustrated, an inter-stage matching circuit is disposed between the first power amplifier 31 and the second power amplifier 32 and between the second power amplifier 32 and the third power amplifier 33. As illustrated in FIG. 2B, in a case where the variable attenuator 34 is disposed between the first power amplifier 31 and the second power amplifier 32, or, as illustrated in FIG. 2C, in a case where the variable attenuator 34 is disposed between the second power amplifier 32 and the third power amplifier 33, the corresponding inter-stage matching circuit may include the variable attenuator 34.

Although not illustrated, an output matching circuit is disposed subsequent to the third power amplifier 33, that is, disposed in the output stage of the amplifier unit 3. As illustrated in FIG. 2D, in a case where the variable attenuator 34 is disposed subsequent to the third power amplifier 33, the output matching circuit may include the variable attenuator 34.

Figure 3:
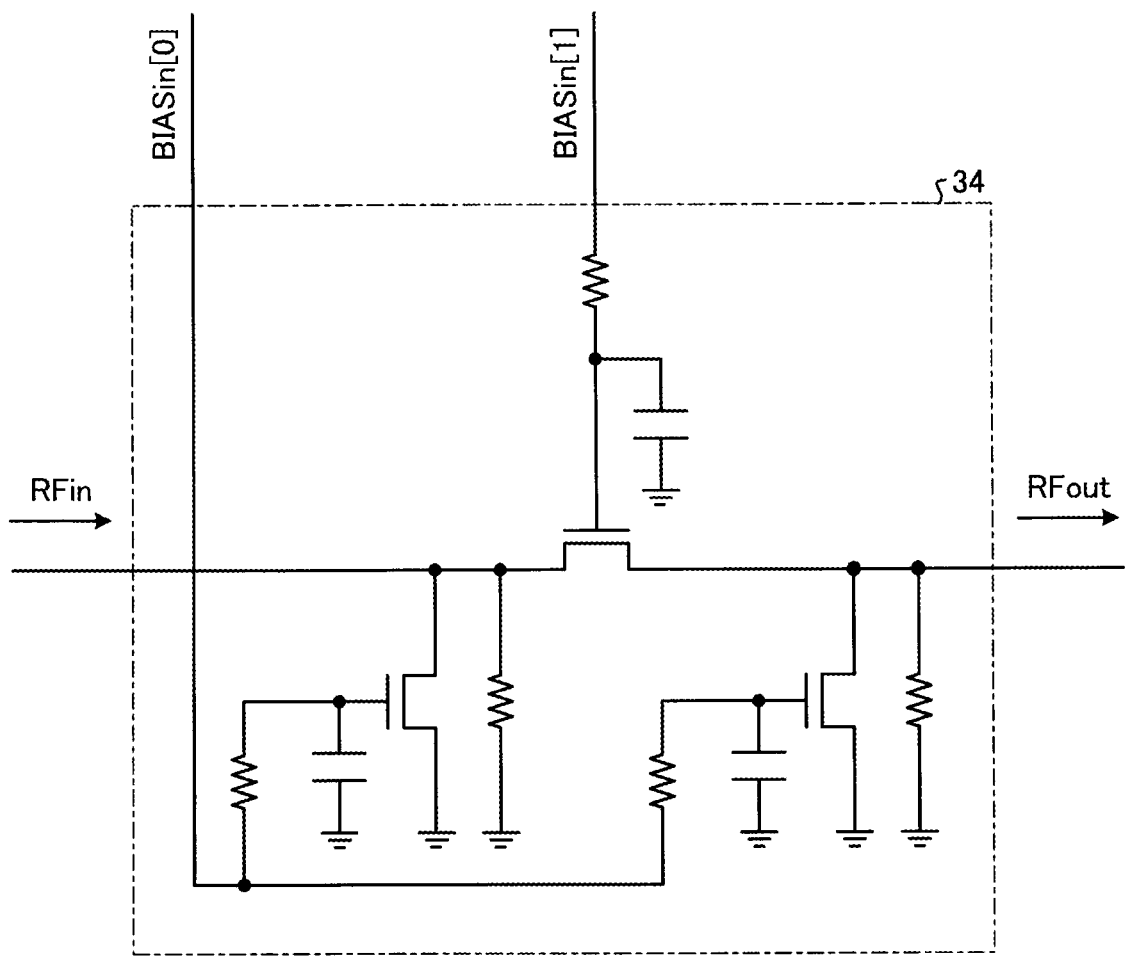
FIG. 3 is a block diagram illustrating an exemplary implementation of a variable attenuator.

FIG. 3 is a block diagram illustrating an exemplary implementation of the variable attenuator 34. The configuration of the variable attenuator 34 is not limited to the illustrated configuration, and the variable attenuator 34 may have a desired configuration, such as a π-type or T-type configuration.

In FIG. 3, BIASin[0] and BIASin[1] represent input values of bias values output from the bias generation unit 7. The number of bias values may be determined as desired in accordance with the degree of process variation in the semiconductor device 2.

Figures 4, 5:
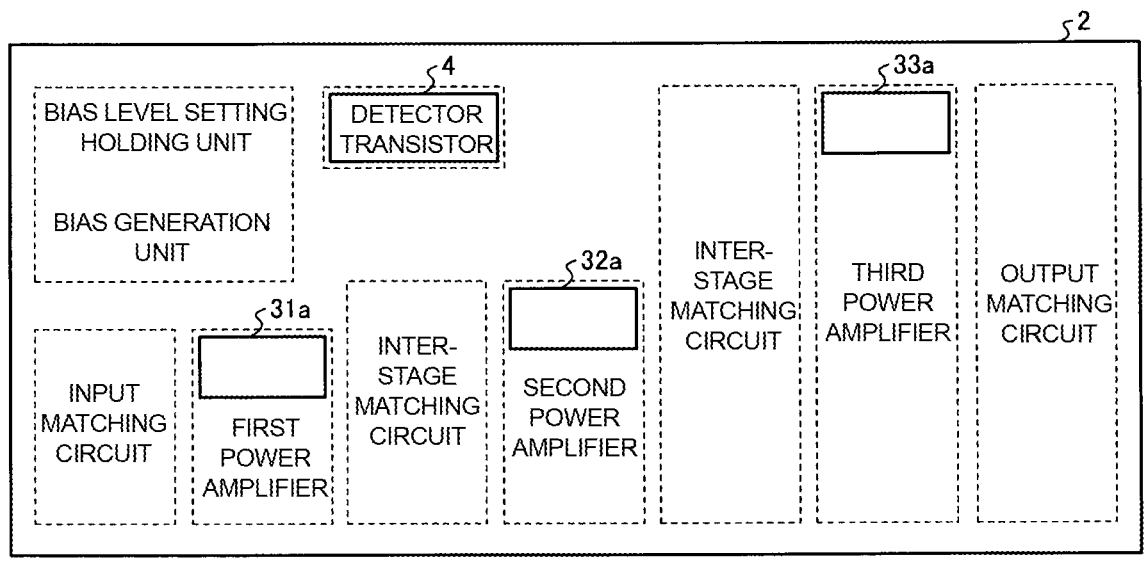
FIG. 4 is a conceptual diagram illustrating an example arrangement of blocks on a die of a semiconductor device constituting the power amplifier circuit according to the first embodiment.
FIG. 5 illustrates an example of 3-bit data generated by a data generation unit of a bias level setting unit according to the first embodiment.

FIG. 4 is a conceptual diagram illustrating an example arrangement of blocks on the die of the semiconductor device 2 constituting the power amplifier circuit 1 according to the first embodiment.

As illustrated in FIG. 4, the detector transistor 4 is formed on the die of the semiconductor device 2. The detector transistor 4 has a transistor that uses the same process as that of amplifier transistors 31a, 32a, and 33a of the first power amplifier 31, the second power amplifier 32, and the third power amplifier 33. Accordingly, in a case where the detector transistor 4 and the amplifier transistors 31a, 32a, and 33a are bipolar transistors, the amplification factor of the amplifier transistors 31*a*, 32*a*, and 33*a* can be regarded as being equivalent to the amplification factor of the detector transistor 4. Thus, if the amplification factor of the detector transistor 4 is detected, setting the attenuation of the variable attenuator 34 to a value according to the amplification factor of the detector transistor 4 can compensate for the gain variation in the amplifier unit 3 due to process variation in the semiconductor device 2.

In a case where the detector transistor 4 and the amplifier transistors 31*a*, 32*a*, and 33*a* are field-effect transistors, the transconductance of the amplifier transistors 31*a*, 32*a*, and 33*a* can be regarded as being equivalent to the transconductance of the detector transistor 4. Thus, if the transconductance of the detector transistor 4 is detected, setting the attenuation of the variable attenuator 34 to a value according to the transconductance of the detector transistor 4 can compensate for the gain variation in the amplifier unit 3 due to process variation in the semiconductor device 2.

In this embodiment, as illustrated in FIG. 1, in the manufacturing process of the semiconductor device 2 constituting the power amplifier circuit 1, a bias level setting unit 5 is connected to the semiconductor device 2. The bias level setting unit 5 is implementable by, for example, a setting jig, such as a personal computer (PC) connected to the semiconductor device 2 in a predetermined step of the manufacturing process. The bias level setting unit 5 includes a calculation unit 51 and a data generation unit 52.

In a case where the detector transistor 4 and the amplifier transistors 31*a*, 32*a*, and 33*a* are bipolar transistors, the calculation unit 51 detects collector current Ic and base current Ib flowing through the detector transistor 4. An amplification factor β of the detector transistor 4 can be calculated using Equation (1) below.

$$\beta = Ic/Ib \quad (1)$$

The calculation unit 51 calculates the amplification factor β of the detector transistor 4 using Equation (1).

In a case where the detector transistor 4 and the amplifier transistors 31*a*, 32*a*, and 33*a* are field-effect transistors, a gate voltage Vg of the detector transistor 4 is swung at least at two points, and drain current Id is detected at least at two points. A transconductance gm of the detector transistor 4 can be calculated using Equation (2) below.

$$gm = \Delta Id/\Delta Vg = (Id2-Id1)/(Vg2-Vg1) \quad (2)$$

The calculation unit 51 calculates the transconductance gm of the detector transistor 4 using Equation (2).

The data generation unit 52 outputs 3-bit data according to the amplification factor β (or the transconductance gm) calculated by the calculation unit 51. Examples of the data generation unit 52 include an analog-to-digital (A/D) conversion circuit. FIG. 5 illustrates an example of 3-bit data generated by the data generation unit 52 of the bias level setting unit 5 according to the first embodiment. In FIG. 5, the amplification factor β obtained in a case where the detector transistor 4 and the amplifier transistors 31*a*, 32*a*, and 33*a* are bipolar transistors is represented by 3-bit data, by way of example.

Specifically, when the value of the amplification factor β is greater than or equal to A and less than B (A≤β<B), the data generation unit 52 outputs data value "000".

When the value of the amplification factor β is greater than or equal to B and less than C (B≤β<C), the data generation unit 52 outputs data value "001".

When the value of the amplification factor β is greater than or equal to C and less than D (C≤β<D), the data generation unit 52 outputs data value "010".

When the value of the amplification factor β is greater than or equal to D and less than E (D≤β<E), the data generation unit 52 outputs data value "011".

When the value of the amplification factor β is greater than or equal to E and less than F (E≤β<F), the data generation unit 52 outputs data value "100".

When the value of the amplification factor β is greater than or equal to F and less than G (F≤β<G), the data generation unit 52 outputs data value "101".

When the value of the amplification factor β is greater than or equal to G and less than H (G≤β<H), the data generation unit 52 outputs data value "110".

When the value of the amplification factor β is greater than or equal to H and less than I (H≤β<I), the data generation unit 52 outputs data value "111".

The number of bits of the data value output from the data generation unit 52 is not limited to 3, but may be 2 or 4 or more. The number of bits of the data value output from the data generation unit 52 may be determined as desired in accordance with the degree of process variation in the semiconductor device 2.

Figure 6:
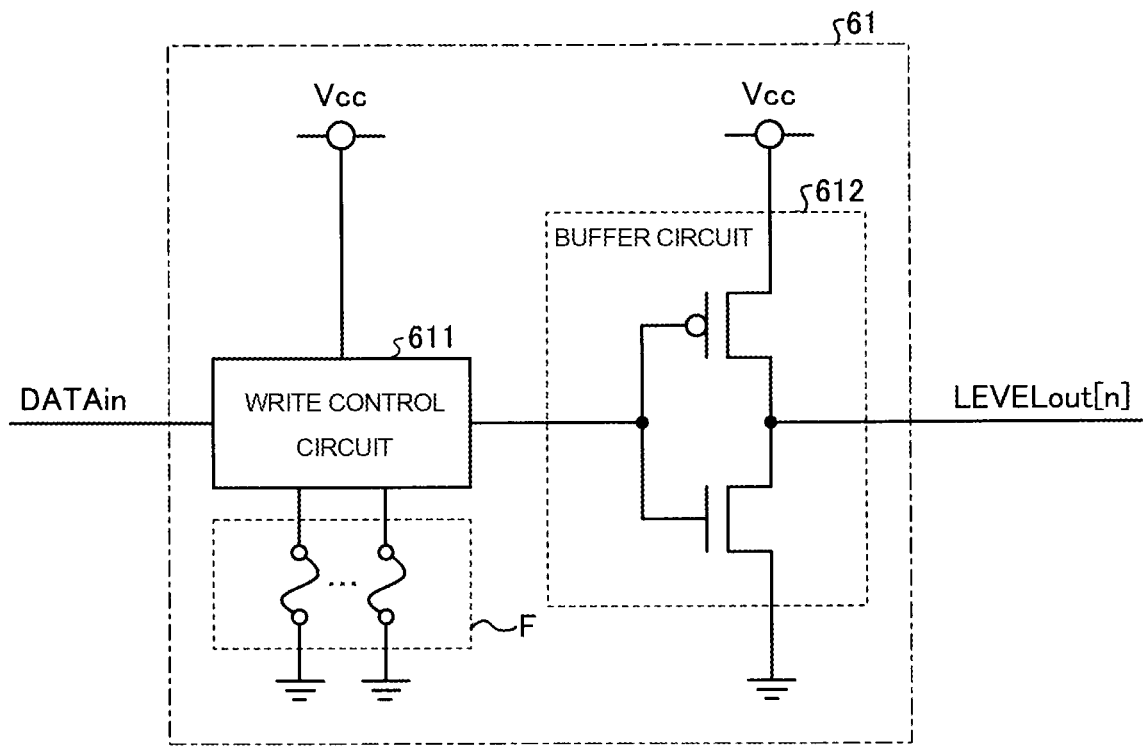
FIG. 6 is a block diagram illustrating an exemplary implementation of a non-volatile memory in the bias level setting holding unit according to the first embodiment.

FIG. 6 is a block diagram illustrating an exemplary implementation of a non-volatile memory in the bias level setting holding unit 6 according to the first embodiment. In this embodiment, the bias level setting holding unit 6 includes a non-volatile memory 61.

In FIG. 6, LEVELout[n] represents an output value of a bias level setting value determined by the data value (DATAin) output from the data generation unit 52. The number n of bias level setting values may be determined as desired in accordance with the degree of process variation in the semiconductor device 2.

In this embodiment, the non-volatile memory 61 includes a plurality of fuses F on the die of the semiconductor device 2. The plurality of fuses F open or close to hold the bias level setting of the variable attenuator 34, by way of example.

In this embodiment, the non-volatile memory 61 includes a write control circuit 611 and a buffer circuit 612.

In accordance with the data value (DATAin) output from the data generation unit 52, the write control circuit 611 causes current to flow through a fuse F corresponding to the data value among the fuses F. The resistance value of a fuse F through which current exceeding the current-carrying capacity flows changes.

The buffer circuit 612 outputs a bias level setting value in accordance with the opening or closing of the plurality of fuses F.

This configuration can reduce the circuit size of the bias level setting holding unit 6.

The implementation of the non-volatile memory 61 is not limited to the configuration described above. The non-volatile memory 61 may be a one-time programmable (OTP) read only memory that is writable only once in the manufacturing process of the semiconductor device 2 constituting the power amplifier circuit 1.

Figure 7:
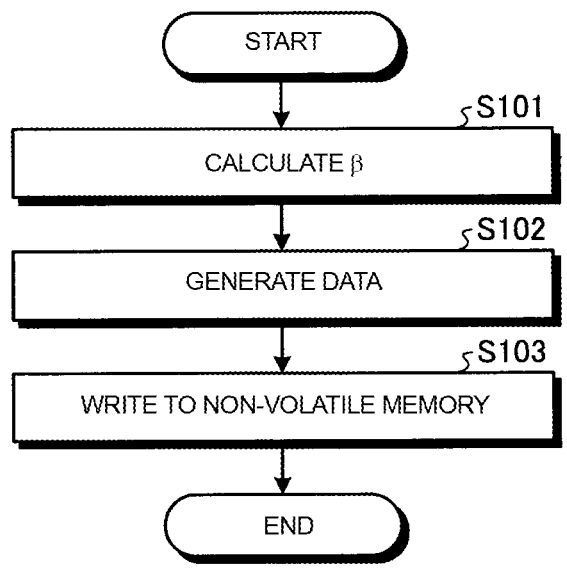
FIG. 7 is a flowchart illustrating an example method for manufacturing a semiconductor device according to the first embodiment.

FIG. 7 is a flowchart illustrating an example method for manufacturing a semiconductor device according to the first embodiment. In this embodiment, a bias level setting process illustrated in FIG. 7 is performed in the manufacturing process of the semiconductor device 2 constituting the power amplifier circuit 1.

In the manufacturing process of the semiconductor device 2 constituting the power amplifier circuit 1, first, the calculation unit 51 detects the collector current Ic and the base current Ib flowing through the detector transistor 4 and calculates the amplification factor β of the detector transistor 4 using Equation (1) above (step S101).

Then, the data generation unit 52 generates and outputs 3-bit data according to the amplification factor β calculated by the calculation unit 51 (step S102).

The bias level setting holding unit 6 writes a value corresponding to the data value of the 3-bit data output from the data generation unit 52 to the non-volatile memory 61 as a bias level setting value (step S103).

Through the bias level setting process according to the first embodiment described above, a bias level according to the amplification factor β of the detector transistor 4 is set.

Figure 8:
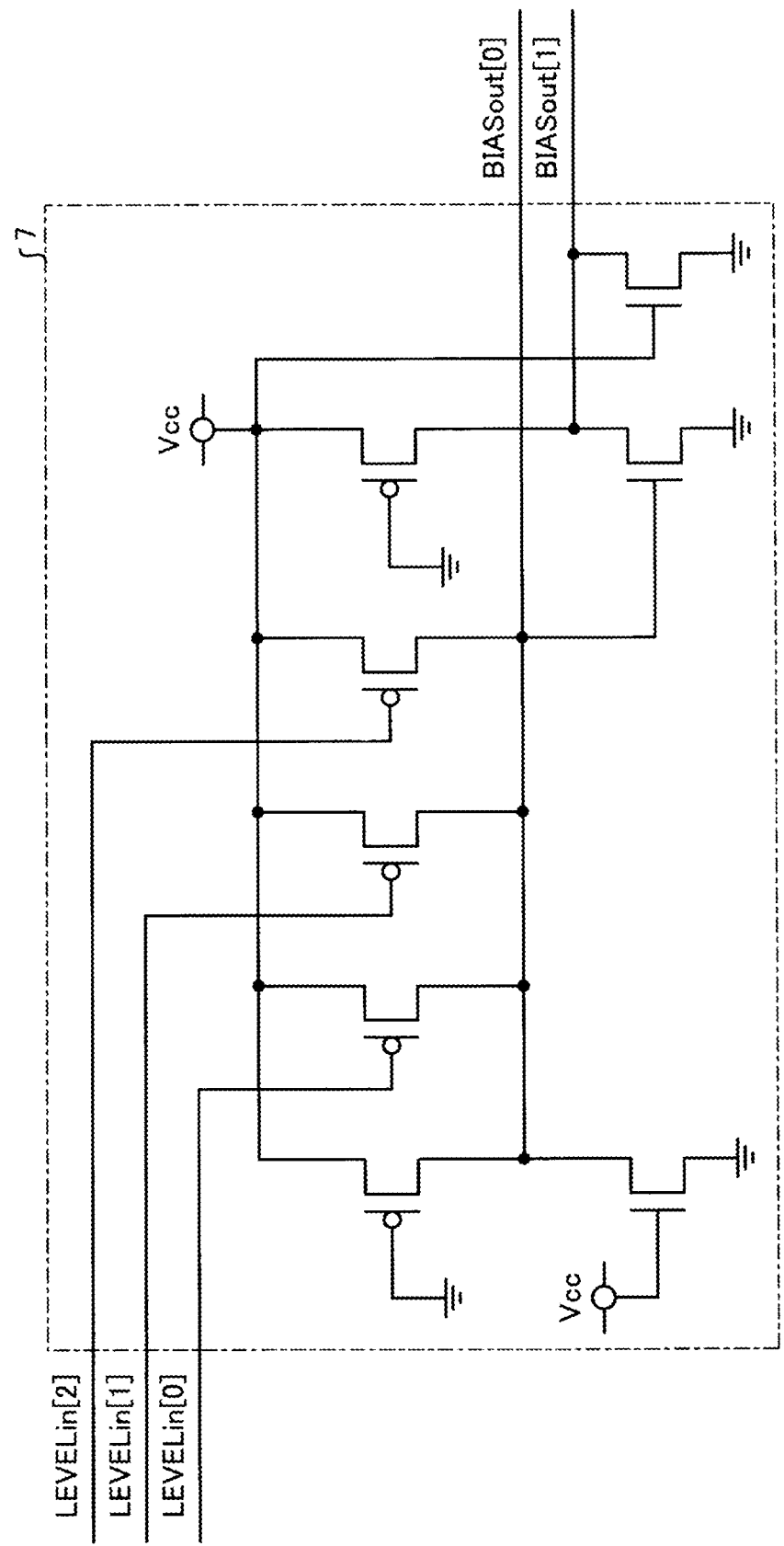
FIG. 8 illustrates an exemplary implementation of a bias generation unit.

FIG. 8 illustrates an exemplary implementation of the bias generation unit 7. As illustrated in FIG. 8, the bias generation unit 7 is a circuit constituted by, for example, a plurality of metal oxide semiconductor field-effect transistors (MOSFETs).

During actual operation of the power amplifier circuit 1, the bias generation unit 7 receives a bias level setting value output from the data generation unit 52. In FIG. 8, LEVELin[0], LEVELin[1], and LEVELin[2] represent input values of bias level setting values output from the data generation unit 52. The number of bias level setting values may be determined as desired in accordance with the degree of process variation in the semiconductor device 2, as described above.

The implementation of the bias generation unit 7 is not limited to the configuration illustrated in FIG. 8 and may be modified as desired.

The bias generation unit 7 outputs a bias value in accordance with the input values LEVELin[0], LEVELin[1], and LEVELin[2] of the bias level setting values. In FIG. 8, BIASout[0] and BIASout[1] represent output values of bias values output from the bias generation unit 7. The number of bias values may be determined as desired in accordance with the degree of process variation in the semiconductor device 2, as described above.

The power amplifier circuit 1 according to the first embodiment having the configuration described above can compensate for gain variation due to process variation in the semiconductor device 2 constituting the power amplifier circuit 1.

Second Embodiment

Figure 9:
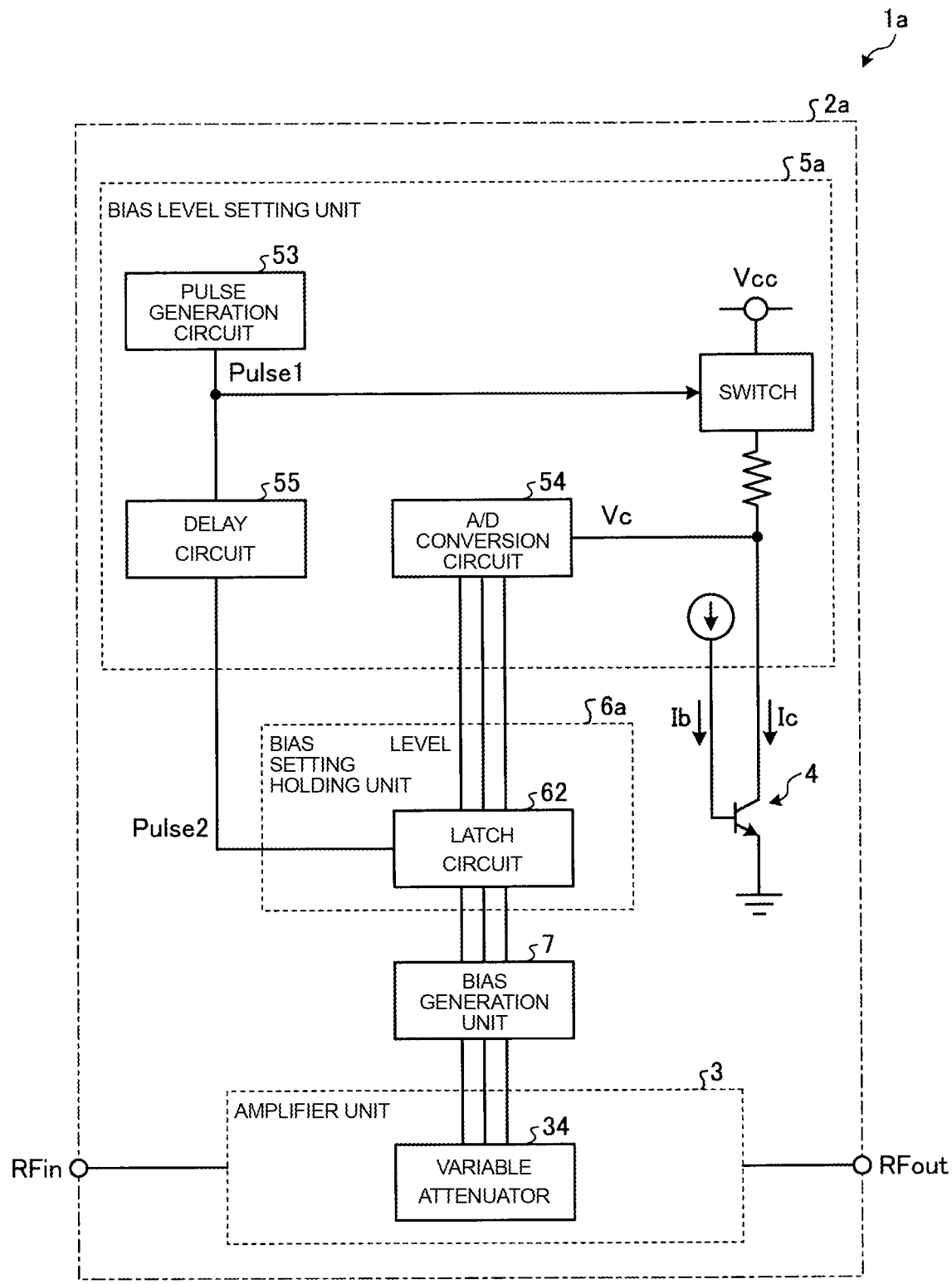
FIG. 9 illustrates a schematic configuration of a power amplifier circuit according to a second embodiment.

FIG. 9 illustrates a schematic configuration of a power amplifier circuit according to a second embodiment. In the second embodiment, substantially the same components as those in the first embodiment are identified by the same reference numerals and will not be described herein.

As illustrated in FIG. 9, a power amplifier circuit 1a according to the second embodiment includes a bias level setting unit 5a on a die of a semiconductor device 2a. In the configuration according to the second embodiment, which will be described below, a bias level of the variable attenuator 34 can be set without necessarily providing a setting jig, such as a PC in the manufacturing process of the semiconductor device 2a constituting the power amplifier circuit 1a.

As illustrated in FIG. 9, the bias level setting unit 5a includes a pulse generation circuit 53, an A/D conversion circuit 54, and a delay circuit 55.

The pulse generation circuit 53 is a circuit that, for example, generates a pulse signal Pulse1, which is set to high ("H") level for a predetermined period, in response to power being supplied to the semiconductor device 2a.

The collector current Ic flows through the detector transistor 4 during the "H" period of the pulse signal Pulse1 output from the pulse generation circuit 53.

The A/D conversion circuit 54 converts a collector voltage Vc generated by the flow of the collector current Ic through the detector transistor 4 into digital signals and outputs the digital signals to a bias level setting holding unit 6a as parallel data. The number of outputs of parallel data may be determined as desired in accordance with the degree of process variation in the semiconductor device 2a.

The delay circuit 55 delays the pulse signal Pulse1 output from the pulse generation circuit 53 to generate a pulse signal Pulse2 and outputs the pulse signal Pulse2.

In this embodiment, the bias level setting holding unit 6a includes a latch circuit 62 in place of the non-volatile memory 61 according to the first embodiment.

Figure 10:
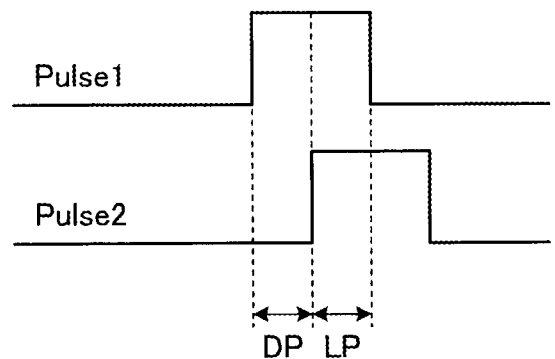
FIG. 10 is a timing chart illustrating an example operation timing of a bias level setting holding unit according to the second embodiment and an example write timing of a latch circuit in the bias level setting holding unit.

FIG. 10 is a timing chart illustrating an example operation timing of the bias level setting holding unit 6a according to the second embodiment and an example write timing of the latch circuit 62 in the bias level setting holding unit 6a.

During the "H" period of the pulse signal Pulse1 illustrated in FIG. 10, the collector current Ic flows through the detector transistor 4.

The delay circuit 55 outputs the pulse signal Pulse2 that rises to the "H" level with a delay of a predetermined delay period DP shorter than the "H" period of the pulse signal Pulse1 with respect to the rise of the pulse signal Pulse1 output from the pulse generation circuit 53. Accordingly, a latch period LP is generated during which both the pulse signal Pulse1 and the pulse signal Pulse2 are in the "H" level. During the latch period LP, the latch circuit 62 holds the parallel data output from the A/D conversion circuit 54 as a bias level setting value.

Figure 11:
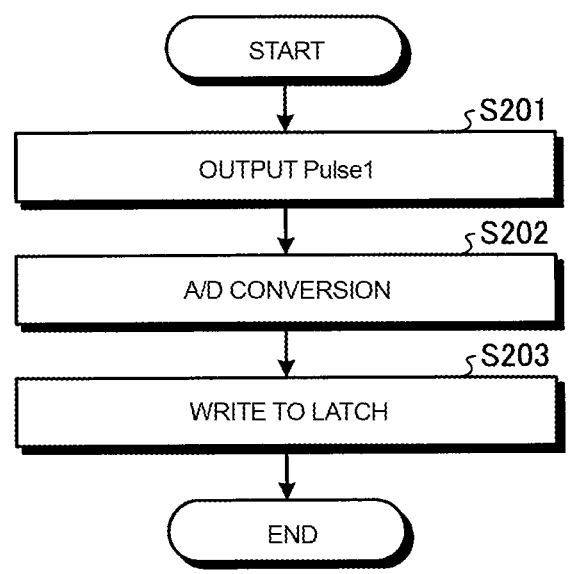
FIG. 11 is a flowchart illustrating an example method for manufacturing a semiconductor device according to the second embodiment.

FIG. 11 is a flowchart illustrating an example method for manufacturing a semiconductor device according to the second embodiment. An example will be described here in which a bias level setting process illustrated in FIG. 11 is performed in the manufacturing process of the semiconductor device 2a constituting the power amplifier circuit 1a.

In the manufacturing process of the semiconductor device 2a constituting the power amplifier circuit 1a, first, the pulse generation circuit 53 outputs the pulse signal Pulse1 (step S201). In response to the pulse signal Pulse1, the collector current Ic flows through the detector transistor 4.

Then, the A/D conversion circuit 54 performs A/D conversion of the collector voltage Vc generated by the flow of the collector current Ic through the detector transistor 4 (step S202) to generate parallel data, and outputs the parallel data to the bias level setting holding unit 6a.

The bias level setting holding unit 6a writes the parallel data output from the A/D conversion circuit 54 to the latch circuit 62 as a bias level setting value during the latch period LP (step S203).

Through the bias level setting process according to the second embodiment described above, a bias level according to the amplification factor β of the detector transistor 4 is set.

During actual operation of the power amplifier circuit 1a, the bias generation unit 7 receives a bias level setting value output from the bias level setting holding unit 6a. The subsequent operation is similar to that in the first embodiment.

The power amplifier circuit 1a according to the second embodiment having the configuration described above can compensate for gain variation due to process variation in the semiconductor device 2a constituting the power amplifier circuit 1a.

In this embodiment, as described above, the bias level setting holding unit 6a includes the latch circuit 62 in place of the non-volatile memory 61 according to the first embodiment. Unlike the non-volatile memory 61, the latch circuit 62 is rewritable in accordance with the operation of the bias level setting unit 5a. In the example described above, the bias level setting process illustrated in FIG. 11 is performed in the manufacturing process of the semiconductor device 2a constituting the power amplifier circuit 1a. In the configuration according to this embodiment, however, the bias level of the variable attenuator 34 can be set by activating the bias level setting unit 5a at a desired timing. In the configuration according to this embodiment, therefore, as described above, the bias level of the variable attenuator 34 can be set without necessarily providing a setting jig, such as a PC in the manufacturing process of the semiconductor device 2a constituting the power amplifier circuit 1a. In addition, the bias level of the variable attenuator 34 can also be set after the shipment of the semiconductor device 2a constituting the power amplifier circuit 1a, for example. Furthermore, the temperature characteristics of amplifier transistors constituting the amplifier unit 3 can be compensated for by executing the bias level setting process illustrated in FIG. 11 during actual operation of the power amplifier circuit 1a, for example, at the startup of the power amplifier circuit 1a.

In the embodiments described above, the amplifier unit 3 is an RF power amplifier with a three-stage configuration, by way of example but not limitation. The amplifier unit 3 may include any other number of stages of power amplifiers. Any configuration capable of, using the variable attenuator 34, compensating for the gain variation in the amplifier unit 3 due to process variation in the amplification factor (or transconductance) of amplifier transistors constituting the amplifier unit 3 may be used. For example, the amplifier unit 3 may include two stages of power amplifiers or four or more stages of power amplifiers, or may include a single power amplifier.

The embodiments described above are provided to facilitate understanding of the present disclosure and are not to be construed as limiting the present disclosure. The present disclosure may be modified or improved without necessarily departing from the spirit thereof, and the present disclosure also includes equivalents thereof.

The present disclosure can have the following configurations, as described above or in place of the above-described configurations.

(1) A power amplifier circuit according to embodiments of the present disclosure includes an amplifier unit disposed on a die of a semiconductor device, the amplifier unit including an amplifier transistor; a detector transistor disposed on the die of the semiconductor device; a variable attenuator that compensates for a gain of the amplifier unit; a bias level setting holding unit that holds a bias level setting value, the bias level setting value being set based on at least a detection value of the detector transistor; and a bias generation unit that generates a bias value of the variable attenuator based on a bias level setting value output from the bias level setting holding unit.

This configuration can compensate for the gain variation in the amplifier unit due to process variation in the semiconductor device.

(2) In the power amplifier circuit according to (1) above, data for setting the bias level setting value is input from a bias level setting unit connected to the semiconductor device.

This configuration can perform bias level setting without necessarily forming a bias level setting unit on the die of the semiconductor device.

(3) In the power amplifier circuit according to (2) above, the bias level setting holding unit is preferably a non-volatile memory.

(4) In the power amplifier circuit according to (3) above, the non-volatile memory includes a plurality of fuses disposed on the die of the semiconductor device.

(5) In the power amplifier circuit according to (4) above, one or more fuses among the plurality of fuses of the non-volatile memory have a resistance value that changes in accordance with the bias level setting value.

This configuration can reduce the circuit size of the bias level setting holding unit.

(6) The power amplifier circuit according to (1) above further includes a bias level setting unit that sets the bias level setting value based on at least the detection value of the detector transistor. The bias level setting unit is disposed on the die of the semiconductor device.

This configuration can perform bias level setting without necessarily providing a setting jig, such as a PC for performing bias level setting in a manufacturing process of the semiconductor device.

(7) In the power amplifier circuit according to (6) above, the bias level setting holding unit is a latch circuit.

This configuration can perform bias level setting during actual operation of the power amplifier circuit.

(8) In the power amplifier circuit according to any one of (1) to (7) above, the bias generation unit is preferably a circuit including a plurality of transistors.

(9) In the power amplifier circuit according to any one of (1) to (8) above, the semiconductor device includes silicon germanium as a semiconductor material.

This configuration can suppress process variation in the current amplification factor of an amplifier transistor made of silicon germanium.

(10) A semiconductor device according to embodiments of the present disclosure includes an amplifier unit including an amplifier transistor; a detector transistor; a variable attenuator that compensates for a gain of the amplifier unit; a bias level setting holding unit that holds a bias level setting value, the bias level setting value being set based on at least a detection value of the detector transistor; and a bias generation unit that generates a bias value of the variable attenuator based on the bias level setting value, and at least the amplifier transistor and the detector transistor are disposed on an identical die.

This configuration can compensate for the gain variation in the amplifier unit due to process variation in the semiconductor device.

(11) In the semiconductor device according to (10) above, data for setting the bias level setting value is input from a bias level setting unit disposed outside the semiconductor device.

This configuration can perform bias level setting without necessarily forming a bias level setting unit on the die of the semiconductor device.

(12) In the semiconductor device according to (11) above, the bias level setting holding unit is preferably a non-volatile memory.

(13) In the semiconductor device according to (12) above, the non-volatile memory includes a plurality of fuses disposed on the die on which the amplifier transistor and the detector transistor are disposed.

(14) In the semiconductor device according to (13) above, one or more fuses among the plurality of fuses of the non-volatile memory have a resistance value that changes in accordance with the bias level setting value.

This configuration can reduce the circuit size of the bias level setting holding unit.

(15) In the semiconductor device according to (10) above, a bias level setting unit that sets the bias level setting value based on at least the detection value of the detector transistor is disposed on the die on which the amplifier transistor and the detector transistor are disposed.

This configuration can perform bias level setting without necessarily providing a setting jig, such as a PC for performing bias level setting in a manufacturing process of the semiconductor device.

(16) In the semiconductor device according to (15) above, the bias level setting holding unit is a latch circuit.

This configuration can perform bias level setting during actual operation of the power amplifier circuit.

(17) In the semiconductor device according to any one of (10) to (16) above, the bias generation unit is preferably a circuit including a plurality of transistors.

(18) In the semiconductor device according to any one of (10) to (17) above, the semiconductor device includes silicon germanium as a semiconductor material.

This configuration can suppress process variation in the current amplification factor of an amplifier transistor made of silicon germanium.

(19) A method for manufacturing a semiconductor device according to embodiments of the present disclosure is a method for manufacturing a semiconductor device including an amplifier unit including an amplifier transistor, a detector transistor, a variable attenuator that compensates for a gain of the amplifier unit, a bias level setting holding unit that holds a bias level setting value, the bias level setting value being set based on at least a detection value of the detector transistor, and a bias generation unit that generates a bias value of the variable attenuator based on the bias level setting value, at least the amplifier transistor and the detector transistor being disposed on an identical die. The method includes the steps of calculating an amplification factor of the detector transistor; generating the bias level setting value based on the amplification factor; and writing the bias level setting value to the bias level setting holding unit.

This can compensate for the gain variation in the amplifier unit due to process variation in the semiconductor device.

According to embodiments of the present disclosure, it is possible to implement a power amplifier circuit, a semiconductor device, and a method for manufacturing the semiconductor device in which gain variation due to process variation in the semiconductor device can be compensated for.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A power amplifier circuit comprising:
    an amplifier on a die of a semiconductor device, the amplifier comprising an amplifier transistor;
    a detector transistor on the die of the semiconductor device;
    a variable attenuator configured to compensate for a gain of the amplifier;
    a bias level setting holding circuit configured to store a bias level setting value, the bias level setting value being based on at least a detection value of the detector transistor; and
    a bias generation circuit configured to bias the variable attenuator at a bias level based on the bias level setting value.

2. The power amplifier circuit according to claim 1, wherein data for setting the bias level setting value is input from a bias level setting circuit connected to the semiconductor device.

3. The power amplifier circuit according to claim 2, wherein the bias level setting holding circuit comprises non-volatile memory.

4. The power amplifier circuit according to claim 3, wherein the non-volatile memory comprises a plurality of fuses on the die of the semiconductor device.

5. The power amplifier circuit according to claim 4, wherein at least one of the plurality of fuses has a resistance that changes in accordance with the bias level setting value.

6. The power amplifier circuit according to claim 4, wherein the semiconductor device comprises silicon germanium as a semiconductor material.

7. The power amplifier circuit according to claim 1, further comprising:
    a bias level setting circuit configured to set the bias level setting value based on at least the detection value of the detector transistor,
wherein the bias level setting circuit is on the die of the semiconductor device.

8. The power amplifier circuit according to claim 7, wherein the bias level setting holding circuit comprises a latch circuit.

9. The power amplifier circuit according to claim 1, wherein the bias generation circuit comprises a plurality of transistors.

10. The power amplifier circuit according to claim 1, wherein the semiconductor device comprises silicon germanium as a semiconductor material.

11. A semiconductor device comprising:
    an amplifier comprising an amplifier transistor;
    a detector transistor;
    a variable attenuator configured to compensate for a gain of the amplifier;
    a bias level setting holding circuit configured to store a bias level setting value, the bias level setting value being based on at least a detection value of the detector transistor; and
    a bias generation circuit configured to bias the variable attenuator at a bias level based on the bias level setting value,
    wherein at least the amplifier transistor and the detector transistor are on the same die.

12. The semiconductor device according to claim 11, wherein data for setting the bias level setting value is input from a bias level setting circuit outside the semiconductor device.

13. The semiconductor device according to claim 12, wherein the bias level setting holding circuit comprises non-volatile memory.

14. The semiconductor device according to claim 13, wherein the non-volatile memory comprises a plurality of fuses on the die on which the amplifier transistor and the detector transistor are disposed.

15. The semiconductor device according to claim 14, wherein at least one of the plurality of fuses has a resistance that changes in accordance with the bias level setting value.

16. The semiconductor device according to claim 11, wherein a bias level setting circuit is on the die on which the amplifier transistor and the detector transistor are disposed, the bias level setting circuit being configured to set the bias level setting value based on at least the detection value of the detector transistor.

17. The semiconductor device according to claim 16, wherein the bias level setting holding circuit comprises a latch circuit.

18. The semiconductor device according to claim 11, wherein the bias generation circuit comprises a plurality of transistors.

19. The semiconductor device according to claim 11, wherein the semiconductor device comprises silicon germanium as a semiconductor material.

20. A method for manufacturing a semiconductor device comprising an amplifier comprising an amplifier transistor, a detector transistor, a variable attenuator configured to compensate for a gain of the amplifier, a bias level setting holding circuit configured to store a bias level setting value, the bias level setting value being based on at least a detection value of the detector transistor, and a bias generation circuit configured to bias the variable attenuator at a bias level based on the bias level setting value, at least the amplifier transistor and the detector transistor being on the same die, the method comprising the steps of:
  calculating an amplification factor of the detector transistor;
  generating the bias level setting value based on the amplification factor; and
  writing the bias level setting value to the bias level setting holding circuit.

* * * * *